(12) United States Patent
Xu et al.

(10) Patent No.: US 8,748,250 B2
(45) Date of Patent: Jun. 10, 2014

(54) METHOD FOR INTEGRATION OF DUAL METAL GATES AND DUAL HIGH-K DIELECTRICS IN CMOS DEVICES

(75) Inventors: Qiuxia Xu, Beijing (CN); Gaobo Xu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 166 days.

(21) Appl. No.: 13/129,743

(22) PCT Filed: Feb. 21, 2011

(86) PCT No.: PCT/CN2011/071129
§ 371 (c)(1),
(2), (4) Date: May 17, 2011

(87) PCT Pub. No.: WO2011/153845
PCT Pub. Date: Dec. 15, 2011

(65) Prior Publication Data
US 2012/0094447 A1 Apr. 19, 2012

(30) Foreign Application Priority Data
Jun. 8, 2010 (CN) .......................... 2010 1 0199981

(51) Int. Cl.
*H01L 21/8238* (2006.01)
(52) U.S. Cl.
USPC ........................................................ 438/216
(58) Field of Classification Search
USPC ................................... 438/216; 257/E21.639
See application file for complete search history.

(56) References Cited

U.S. PATENT DOCUMENTS 7,510,943 B2 * 3/2009 Li .................................. 438/301
2008/0067606 A1 3/2008 Jung et al. ...................... 257/369

(Continued)

FOREIGN PATENT DOCUMENTS

| CN | 1604339 | 4/2005 |
|----|---------|--------|
| CN | 1832113 | 9/2006 |
| CN | 101179018 | 5/2008 |
| CN | 101675513 | 3/2010 |
| CN | 101685799 | 3/2010 |

OTHER PUBLICATIONS

"Work Function Tunability by Incorporating a Lanthanum and Aluminum into Refractory Metal Nitrides and a /Feasible Integration Process", Wang et al.; I-4244-0161-5/06/$20.00 © 2006 IEEE; 3 pages.

(Continued)

*Primary Examiner* — William D Coleman
(74) *Attorney, Agent, or Firm* — Westman, Champlin & Koehler, P.A.

(57) ABSTRACT

The present invention provides a method for integrating the dual metal gates and the dual gate dielectrics into a CMOS device, comprising: growing an ultra-thin interfacial oxide layer or oxynitride layer by rapid thermal oxidation; forming a high-k gate dielectric layer on the ultra-thin interfacial oxide layer by physical vapor deposition; performing a rapid thermal annealing after the deposition of the high-k; depositing a metal nitride gate by physical vapor deposition; doping the metal nitride gate by ion implantation with P-type dopants for a PMOS device, and with N-type dopants for an NMOS device, with a photoresist layer as a mask; depositing a polysilicon layer and a hard mask by a low pressure CVD process, and then performing photolithography process and etching the hard mask; removing the photoresist, and then etching the polysilicon layer/the metal gate/the high-k dielectric layer sequentially to provide a metal gate stack; forming a first spacer, and performing ion implantation with a low energy and a large angle for source/drain extensions; forming a second spacer, and performing ion implantation for source/drain regions; performing a thermal annealing so as to adjust of the metal gate work functions for the NMOS and PMOS devices, respectively, in the course when the dopants in the source/drain regions are activated.

9 Claims, 2 Drawing Sheets

(56) References Cited

U.S. PATENT DOCUMENTS

2011/0256701 A1  10/2011  Xu et al.
2011/0287620 A1  11/2011  Xu et al.

OTHER PUBLICATIONS

"Latest Development of Integration of high-k/Dual Metal Gate in Gate First Process" Yongliang et al., vol. 39, No. 6, Dec. 2009; 6 pages.

International Search Report and Written Opinion of International Search Report in Chinese for PCT/CN2011/071129 filed Feb. 2011; 10 pages.

"Gallium-Incorporated TiN Metal Gate with Band-Edge Work Function and Excellent Thermal Stability for PMOS Device Applications", Xu et al., IEEE Electron Device letters, vol. 32, No. 9, Sep. 2011, 3 pages.

* cited by examiner

METHOD FOR INTEGRATION OF DUAL METAL GATES AND DUAL HIGH-K DIELECTRICS IN CMOS DEVICES

This application is a Section 371 National Stage Application of International Application No. PCT/CN2011/071129, filed on Feb. 21, 2011, which claims priority to CN 201010199981.9, filed on Jun. 8, 2010, the entire contents of which are incorporated herein by reference in their entirety.

BACKGROUND OF THE INVENTION

1. Field of Invention

The present invention relates to semiconductor technique, and more particularly, to a method for integration of dual metal gates and dual high-k dielectrics in CMOS devices, which may be applied for fabricating a high performance complementary metal-oxide-semiconductor (CMOS) device of the technology generation of 45 nanometers and beyond.

2. Description of Prior Art

As the feature size of the CMOS device is increasingly scaled, it is an inevitable trend for application of high-k (dielectric constant) gate dielectrics and metal gates. The high-k gate dielectric layer has a larger physical thickness at the same equivalent oxide thickness (EOT), which may significantly reduce tunneling current of the gate. However, the high-k gate dielectric layer is not compatible with the conventional polysilicon gate, which may lead to serious Fermi level pinning effects. Therefore, it is necessary that the conventional polysilicon gate be replaced with a novel metal gate. The application of metal gates may eliminate depletion effects of the polysilicon gate, reduce gate resistance and alleviate boron penetration effects, so as to improve reliability of devices. However, there are still some challenges in the integration of the metal gate with the high-k gate dielectric layer, such as thermal stability, interface states, especially the big challenge of the achievement for an appropriately low threshold voltage required by nano CMOS devices due to the Fermi level pinning effects.

Since N-type MOS (NMOS) device and P-type MOS (PMOS) device should have effective work functions at bottom of the conduction band (about 4.1 eV) of Si and at top of the valence band (about 5.2 eV) of Si, respectively, to achieve an appropriate threshold voltage for nano COMS devices. Thus respective suitable metal gates and high-k dielectrics are generally required for NMOS and PMOS devices, which means integration of dual metal gates and dual high-k gate dielectrics is required. The processes for manufacturing the dual metal gates and the dual high-k gate dielectrics are typically very complicated because of processes such as the requirements of "deposition, photolithography, etching, redeposition, rephotolithography, reetching". Such a process has poor controllability, high manufacturing cost and may not facilitate mass production.

SUMMARY OF THE INVENTION

An object of the present invention is to provide a method for integrating the dual metal gates and the dual gate dielectrics into a CMOS device.

To achieve the above object, there provides a method for integrating the dual metal gates and the dual gate dielectrics into a CMOS device, comprises:

step 1) forming an interfacial oxide layer of SiOx or SiON after formation of a device isolation by rapid thermal annealing at a temperature of 600-800° C. for 20-120 s;

step 2) forming a high-k gate dielectric layer and performing a rapid thermal annealing at a temperature of 600-1050° C. for 4-120 s;

step 3) forming a metal gate, wherein a TiN gate is deposited by a physical vapor deposition (PVD) process;

step 4) doping the metal nitride gate by metal ion implantation with P-type dopants for a PMOS device, and with N-type dopants for an NMOS device, with a photoresist layer as a mask;

step 5) depositing a poly-silicon layer and a hard mask by a low pressure chemical vapor deposition (CVD) process, and then performing photolithography process and etching the hard mask;

step 6) removing the photoresist, and then etching the polysilicon layer/the metal gate/the high-k dielectric layer sequentially to provide a metal gate stack with the hard mask as a shield;

step 7) forming a first spacer, and performing ion implantation with a low energy and a large angle for source/drain extensions;

step 8) forming a second spacer, and performing ion implantation for source/drain regions;

step 9) performing a thermal annealing at a temperature of 600-1050° C. for 2-30 s, wherein in the course when the dopants in the source/drain regions are activated, the metal ions are driven to an interface between the metal gate and the high-k gate dielectric layer and an interface between the high-k gate dielectric layer and the interfacial oxide layer so that the metal ions accumulate at two interfaces, and dipoles are generated by interface reaction, so as to adjust the metal gate work functions of the NMOS and PMOS devices, respectively;

step 10) forming NiSi;

step 11) forming contacts and alloy by performing annealing for alloying in a furnace in $N_2$ or ($N_2+H_2$) at a temperature of 380-450° C. for 30-60 minutes.

Before step 1) of the present method, after the formation of the device isolation, such as a conventional LOCOS or STI, the wafer is cleaned by a conventional cleaning method, and then immersed into a mixed solution of hydrofluoric acid/isopropyl alcohol/water at room temperature for 2-10 minutes, followed by washing with deionized water and spin drying, then immediately into furnace. The mixed solution of hydrofluoric acid/isopropyl alcohol/water has a volume ratio of about 0.2-1.5%:0.01-0.10%:1%.

In step 1) of the present method, the interfacial layer is formed by firstly implanting nitrogen and then performing rapidly thermal annealing, or by firstly performing rapidly thermal annealing to form $SiO_x$ and then performing plasma nitridation to form SiON, or by firstly performing chemical treatment by $O_3$ to form $SiO_x$ and then performing plasma nitridation.

In step 2) of the present method, the high-k gate dielectric layer is any one selected from a Hf based group comprising $HfO_2$, HfAlO, HfAlON, HfSiO, HfSiON, HfLaO and HfLaON etc., and is formed by a physical vapor deposition (PVD) process, a Metal Organic chemical vapor deposition (MOCVD), or an atomic layer deposition process.

In step 3) of the present method, the metal gate of TiN has a thickness of 5-100 nm.

In step 4) of the present method, the element for N type implanted metal ions is Yb, or Er or Tb for an NMOS device, and the element for P type implanted metal ions is Al, or Ga or Pt for a PMOS device.

In step 5) of the present method, the hard mask is $SiO_2$ (0), $Si_3N_4$ (N), or a stack thereof, such as O/N or O/N/O.

In step 6) of the present method, the hard mask is etched by fluorine-based etching, and the polysilicon is etched by fluorine-chlorine-based etching or HBr-chlorine-based etching, and the metal gate of TiN, TaN or MoN is formed by chlorine-based reactive ion etching, or by wet chemical etching.

In step 10 of the present method, the NiSi layer is formed by sputtering a Ni layer of 8-20 nm followed by two step annealing with a selective etching intervened between them; the NiSi layer has a thickness of 15-40 nm.

The method of the present invention is characterized in that dual metal gates and dual high-k gate dielectrics are provided with one metal gate material and one high-k gate dielectric material, by doping the metal gates of the NMOS device and PMOS device by performing different type metal ion implantations, and by driving the implanted ions to the interface between the metal gate and the high-k gate dielectric layer and to the interface between the high-k gate dielectric layer and the interfacial oxide layer by performing a high temperature annealing, in which the implanted metal ions accumulate at two interfaces and an interface reaction occurs. The effective work functions of the NMOS device and PMOS device are thus adjusted respectively, and an appropriate low threshold voltage is thus achieved.

The present invention utilizes a physical vapor deposition (PVD) process to deposit a metal nitride layer or a metal layer on a Hf based high-k dielectric such as HfLaOH, HfSiON, or the like, as a metal gate. For an NMOS device, ions of Yb, or Er or Tb are implanted into the metal gate. For a PMOS device, ions of Al, or Ga or Pt are implanted into the metal gate. The implanted ions are driven to the interface between the metal gate and the high-k gate dielectric layer and to the interface between the high-k gate dielectric layer and the interfacial oxide layer by performing a high temperature annealing, in which the implanted metal ions accumulate at two interfaces and an interface reaction occurs to generate dipoles, which leads to a change of the effective work function. The effective work functions of the NMOS device and PMOS device are thus adjusted respectively. An amount of change of the effective work function is dependent on a metal gate material, types and profiles of implanted ions, and an interface reaction. An appropriate work function of the gate can be achieved by optimizing implantation energy, a dose of the implanted ions, and conditions of the heat treatment, so as to achieve an appropriate threshold voltage.

The present invention simplifies the steps of "deposition, photolithography, etching, redeposition, rephotolithography, reetching" for providing dual metal gates and dual high-k dielectrics. The method is very simple, lowers the manufacturing cost, and is completely compatible with the CMOS process. Thus, the method is convenient for the industrialization of the integrated circuit.

DETAILED DESCRIPTION OF PREFERRED EMBODIMENTS

Figure 3:
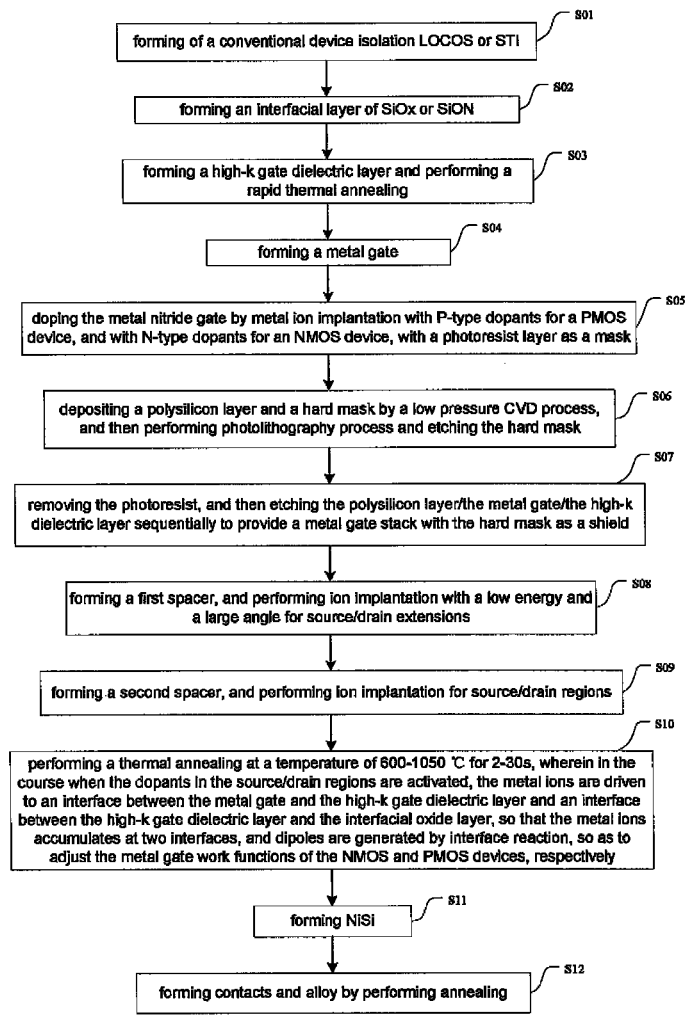
FIG. 3 shows a flowchart illustrating a method of integrating dual metal gates and dual high-k gate dielectrics into a CMOS device.

The present invention provides a method for integrating dual metal gates and dual gate dielectrics into a CMOS device as shown in FIG. 3, comprising the steps of:

step 1) cleaning: after formation of the device isolation at step S01 and before formation of the interfacial oxide layer, the wafer is cleaned by a conventional cleaning method, and then immersed into a mixed solution of hydrofluoric acid/isopropyl alcohol/water at room temperature, followed by washing with deionized water and spin drying and moving into an furnace immediately, wherein the mixed solution of hydrofluoric acid/isopropyl alcohol/water has a volume ratio of about 0.2-1.5%:0.01-0.10%:1%;

step 2) forming an interfacial layer of SiOx or SiON by rapid thermal annealing at a temperature of 600-800° C. for 20-120 s (step S02 in FIG. 3);

step 3) forming a high-k gate dielectric layer (step S03 in FIG. 3);

step 4) performing a rapid thermal annealing after the formation of the high-k gate dielectric layer at a temperature of 600-1050° C. for 4-120 s;

step 5) forming a metal gate, wherein a TiN gate is deposited by a PVD process (step S04 in FIG. 3);

step 6) doping the metal nitride gate of the PMOS (or NMOS) device by P-type (or N-type) metal ions implantation with the photoresist layer as a mask (step S05 in FIG. 3);

step 7) depositing a poly-silicon layer and a hard mask by a low pressure CVD process, and then performing photolithography process and etching the hard mask (step S06 in FIG. 3);

step 8) removing the photoresist, and then etching the polysilicon layer/the metal gate/the high-k dielectric sequentially to provide a metal gate stack with the hard mask as a shield (step S07 in FIG. 3);

step 9) forming a first spacer, and performing low energy ion implantation and large angle ion implantation for source/drain extensions (step S08 in FIG. 3);

step 10) forming a second spacer, and performing ion implantation for source/drain regions (step S09 in FIG. 3);

step 11) performing a rapid thermal annealing at a temperature of 600-1050° C. for 2-30 s (step S10 in FIG. 3);

step 12) forming NiSi (step S11 in FIG. 3);

step 13) forming contacts and alloy annealing in an furnace in $N_2$ gas at a temperature of 380-450° C. for 30-60 minutes (step S12 in FIG. 3).

The method of the present invention is characterized in that dual metal gates and dual high-k gate dielectrics are provided with only one metal gate material and one high-k gate dielectric material, by doping the metal gates of the NMOS device and PMOS device by means of different type ion implantations, and by driving the implanted metal ions to the interface between the metal gate and the high-k gate dielectric layer and to the interface between the high-k gate dielectric layer and the interfacial oxide layer by means of high temperature annealing, in which the implanted metal ions accumulate at two interfaces and an interface reaction occurs. The effective work functions of the NMOS device and PMOS device can be adjusted respectively, and appropriate low threshold voltage controlled can be achieved.

The present invention simplifies the steps of "deposition, photolithography, etching, redeposition, rephotolithography, and reetching" for providing dual metal gates and dual high-k dielectrics. The method is very simple, lowers the manufacturing cost, increases the yield rate, and is completely compatible with the conventional CMOS process. Thus, the method is convenient for the industrialization of the integrated circuit.

The present invention will be further illustrated in the following paragraphs.

step 1) cleaning, after formation of the device isolation and before formation of the interfacial oxide layer, the wafer is cleaned by a conventional cleaning method, and then immersed into a mixed solution of hydrofluoric acid/isopropyl alcohol/water at room temperature for 2-10 minutes, followed by washing with deionized water and spin drying in $N_2$ and moving into an furnace immediately, wherein the mixed solution of hydrofluoric acid/isopropyl alcohol/water has a volume ratio of about 0.3-0.8%:0.01-0.08%:1%;

step 2) forming an interfacial oxide layer of SiOx by rapid thermal annealing at a temperature of 600-800° C. for 20-120 s in $N_2$, to provide an oxide layer of 6-8 angstroms;

step 3) forming a high-k gate dielectric layer, wherein a HfLaON layer is deposited by alternately sputtering a Hf—La target and a Hf target in Ar/$N_2$ by means of magnetic-controlled reactive sputtering, the operation pressure for the sputtering is $5 \times 10^{-3}$ torr, the sputtering power is 100-500 W, and the thickness of the deposited high-k gate dielectric layer HfLaON is 10-60 angstroms;

step 4) performing cleaning in acetone and absolute alcohol each for 5-10 minutes, then washing in deionized water, and then drying by spinning in $N_2$;

step 5) performing rapid thermal annealing after the formation of the high-k gate dielectric layer, wherein the wafer is moved into an furnace immediately after drying by spinning, and is rapid thermal annealed at a temperature of 600-1000° C. for 10-120 s;

step 6) depositing a metal nitride gate layer, wherein the TiN metal gate layer is formed by sputtering the Ti target in the mixed gas of $N_2$/Ar by magnetic-controlled reactive sputtering, the operation pressure is $5 \times 10^{-3}$ torr, the flow rate of $N_2$ is 2-8 sccm, the sputtering power is 600-1000 W, and the thickness of the TiN layer is 5-100 nm;

step 7) implanting ions of Tb into TiN metal gate layer for an NMOS device, wherein the implantation energy is 10 Kev-120 Kev, and the implantation dose is $3 \times 10^{14}$-$5 \times 10^{15}$/$cm^2$;

step 8) implanting ions of Ga into TiN metal gate layer for a PMOS device, wherein the implantation energy is 5 Kev-80 Kev, and the implantation dose is $3 \times 10^{14}$-$4 \times 10^{15}$/$cm^2$;

step 9) depositing a polysilicon layer and a hard mask by a low pressure CVD process, and then performing photolithography process and etching the hard mask;

step 10) removing the photoresist, and then etching the polysilicon layer/the metal gate/the high-k dielectric to provide a metal gate stack with the hard mask as a shield, wherein the hard mask is etched by fluorine-based etching, and the polysilicon is etched by HBr-chlorine-based etching, the TiTbN or TiGaN metal gate is formed by chlorine-based reactive ion etching, and the RF power is 100-400 W;

step 11) forming a first spacer, and performing low energy ion implantation and large angle ion implantation for source/drain extensions;

step 12) forming a second spacer, and performing ion implantation for source/drain regions;

step 13) performing a rapid thermal annealing at a temperature of 800-1050° C. for 2-30 s in $N_2$, wherein in the course where the dopants in the source/drain regions are activated, the metal ions are driven to an interface between the metal gate and the high-k gate dielectric layer and to an interface between the high-k gate dielectric layer and the interfacial oxide layer, so that the metal ions accumulate at two interfaces, the dipoles are generated by interface reaction, so as to adjust the metal gate work functions of the NMOS and PMOS devices;

step 12) forming NiSi layer having a thickness of 20-24 nm, wherein NiSi is formed by sputtering a Ni layer of 11-13 nm followed by two step annealing with a selective etching intervened between them.

step 13) forming contacts and alloy by performing an annealing for alloying in an furnace in $N_2$ at a temperature of 380-450° C. for 30-60 minutes.

Figure 1:
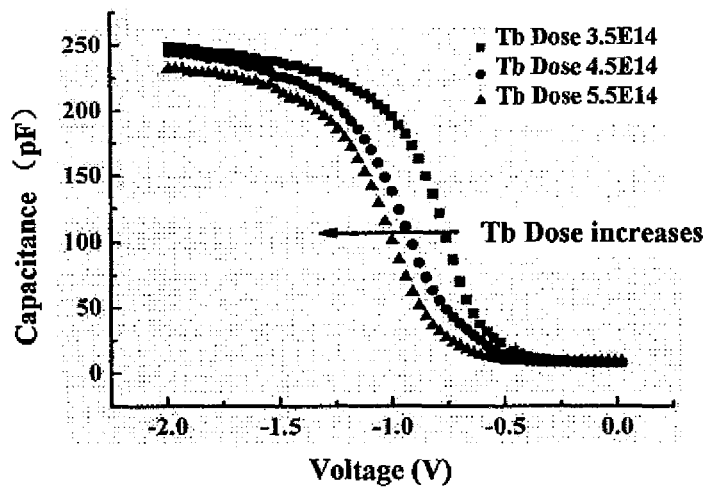
FIG. 1 shows comparison of high frequency C-V characteristics of the gate structure of TiTbN/HfLa(Tb)ON, with different content of Tb in the metal gate of TiTbN.

As shown in FIG. 1, with the increase of the Tb implantation dose in the metal gate of TiN, the C-V characteristic curve shifts towards the negative direction significantly, which indicates that the flat band voltage shifts towards the negative direction significantly, i.e. the work function of the NMOS device is greatly reduced. As shown in Table 1, when the Tb implantation dose is at a level of 5.5E14 $cm^{-2}$, the flat band voltage shifts towards the negative direction by 0.38 V compared with the case having no Tb doped, which satisfies the requirement of the NMOS device.

Figure 2:
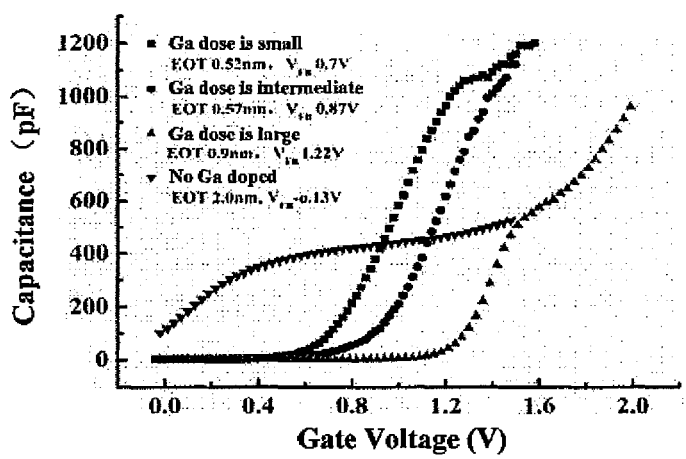
FIG. 2 shows comparison of high frequency C-V characteristics of the gate structure of TiGaN/HfLa(Ga)ON, with different content of Ga in the metal gate of TiGaN.

As shown in FIG. 2, with the increase of the Ga implantation dose in the metal gate TiGaN, the C-V characteristic curve shifts towards the positive direction significantly, which indicates that the flat band voltage shifts towards the positive direction significantly, i.e. the work function of the PMOS device is greatly increased. When the Ga implantation dose is at an intermediate level, the flat band voltage shifts towards the positive direction by 1 V compared with the case having no Ga doped, which is a remarkable value. Moreover, the EOT is greatly reduced because Ga is diffused into the interface between the metal gate and the high-k gate dielectric layer and the interface between the high-k gate dielectric layer and $SiO_2$, and reacts with oxygen and nitrogen therein, so that the K value of the high-k gate dielectric layer is further increased while the thickness of the interfacial $SiO_2$ layer is reduced, and thus the EOT is greatly reduced.

The description mentioned above is only for the purpose of illustration and explanation of preferred embodiments, rather than limiting the present invention. Various modifications, alternations and improvements may occur to those skilled in the art without departing from the true spirit and scope of the invention as defined by the appended claims.

TABLE 1

| Implantation Dose ($cm^{-2}$) | 0 | 3.5E14 | 4.5E14 | 5.5E14 |
|---|---|---|---|---|
| Flat Band Voltage (V) | −0.5 | −0.662 | −0.770 | −0.882 |

The invention claimed is:

1. A method for integrating dual metal gates and dual high-k gate dielectrics into a CMOS device, comprising:

step 1) forming an interfacial layer of SiOx or SiON after formation of a conventional device isolation LOCOS or STI by rapid thermal annealing at a temperature of 600-800° C. for 20-120 s;

step 2) forming a high-k gate dielectric layer and performing a rapid thermal annealing at a temperature of 600-1050° C. for 4-120 s, wherein the high-k gate dielectric layer is made of a Hf based high-k dielectric;

step 3) forming a metal gate, wherein a TiN gate is deposited on the high-k gate dielectric layer by a PVD process;

step 4) doping the metal nitride gate by metal ion implantation with P-type dopants for a PMOS device, and with N-type dopants for an NMOS device, with a photoresist layer as a mask;

step 5) depositing a polysilicon layer and a hard mask by a low pressure CVD process, and then performing photolithography process and etching the hard mask;

step 6) removing the photoresist, and then etching the polysilicon layer/the metal gate/the high-k dielectric layer sequentially to provide a metal gate stack with the hard mask as a shield;

step 7) forming a first spacer, and performing ion implantation with a low energy and a large angle for source/drain extensions;

step 8) forming a second spacer, and performing ion implantation for source/drain regions;

step 9) performing a thermal annealing at a temperature of 600-1050° C. for 2-30 s, wherein in the course when the dopants in the source/drain regions are activated, the metal ions are driven to an interface between the metal gate and the high-k gate dielectric layer and an interface between the high-k gate dielectric layer and the interfacial oxide layer, so that the metal ions accumulate at two interfaces, and dipoles are generated by interface reaction, so as to adjust the metal gate work functions of the NMOS and PMOS devices, respectively;

step 10) forming NiSi;

step 11) forming contacts and alloy by performing annealing for alloying in a furnace in $N_2$ or $(N_2+H_2)$ at a temperature of 380-450° C. for 30-60 minutes.

2. The method according to claim 1, wherein before step 1), after the formation of the conventional device isolation LOCOS or STI, the wafer is cleaned by a conventional cleaning method, and then immersed into a mixed solution of hydrofluoric acid/isopropyl alcohol/water at room temperature for 2-10 minutes, followed by washing with deionized water and spin drying and moving into a furnace immediately after the spin drying, wherein the mixed solution of hydrofluoric acid/isopropyl alcohol/water has a volume ratio of about 0.2-1.5%:0.01-0.10%:1%.

3. The method according to claim 1, wherein in step 1), the interfacial layer is formed by firstly implanting nitrogen and then performing rapidly thermal annealing, or by firstly performing rapidly thermal annealing to form $SiO_x$ and then performing nitridation to form SiON, or by firstly performing chemical treatment by $O_3$ to form $SiO_x$ and then performing plasma nitridation.

4. The method according to claim 1, wherein in step 2), the high-k gate dielectric layer is any one selected from a Hf based group comprising $HfO_2$, HfAlO, HfAlON, HfSiO, HfSiON, HfLaO and HfLaON etc., and is formed by a physical vapor deposition process, a metal organic chemical vapor deposition, or an atomic layer deposition process.

5. The method according to claim 1, wherein in step 3), the metal gate of TiN has a thickness of 5-100 nm.

6. The method according to claim 1, wherein in step 4), the element for N type implanted metal ions is Yb, or Er or Tb for an NMOS device, and the element for P type implanted metal ions is Al, or Ga or Pt for a PMOS device.

7. The method according to claim 1, wherein in step 5), the hard mask is $SiO_2$ (O) or $Si_3N_4$ (N), or a stack thereof, such as O/N or O/N/O.

8. The method according to claim 1, wherein in step 6), the hard mask is etched by fluorine-based etching, and the polysilicon is etched by a fluorine-chlorine-based etching or HBr-chlorine-based etching, and the metal gate of TiN, TaN or MoN is formed by chlorine-based reactive ion etching, or by wet chemical etching.

9. The method according to claim 1, wherein in step 10), the NiSi layer is formed by sputtering a Ni layer of 8-20 nm followed by two step annealing with a selective etching intervened between them, and the NiSi layer has a thickness of 15-40 nm.

* * * * *